United States Patent
Lee et al.

(10) Patent No.: US 11,596,180 B2
(45) Date of Patent: Mar. 7, 2023

(54) AEROSOL GENERATING DEVICE INCLUDING MAGNETIC SENSOR AND METHOD OF OPERATING THE SAME

(71) Applicant: KT&G CORPORATION, Daejeon (KR)

(72) Inventors: Jong Sub Lee, Seongnam-si (KR); Dae Nam Han, Daejeon (KR); Won Kyeong Lee, Guri-si (KR); Byung Sung Cho, Gwangmyeong-si (KR)

(73) Assignee: KT&G CORPORATION, Daejeon (KR)

( * ) Notice: Subject to any disclaimer, the term of this patent is extended or adjusted under 35 U.S.C. 154(b) by 282 days.

(21) Appl. No.: 16/767,463

(22) PCT Filed: Feb. 12, 2020

(86) PCT No.: PCT/KR2020/001933
§ 371 (c)(1),
(2) Date: May 27, 2020

(87) PCT Pub. No.: WO2020/166950
PCT Pub. Date: Aug. 20, 2020

(65) Prior Publication Data
US 2021/0195958 A1    Jul. 1, 2021

(30) Foreign Application Priority Data
Feb. 13, 2019    (KR) .................... 10-2019-0016832

(51) Int. Cl.
A24F 47/00    (2020.01)
A24F 40/51    (2020.01)
(Continued)

(52) U.S. Cl.
CPC .............. *A24F 40/51* (2020.01); *A24F 40/40* (2020.01); *A24F 40/53* (2020.01); *A24F 40/60* (2020.01)

(58) Field of Classification Search
CPC ................................. A24F 40/50; A24F 40/51
See application file for complete search history.

(56) References Cited

U.S. PATENT DOCUMENTS 10,136,679 B1    11/2018    Shotey et al.
2016/0198770 A1    7/2016    Alarcon
(Continued)

FOREIGN PATENT DOCUMENTS

CN    108713798 A    10/2018
CN    109007986 A    12/2018
(Continued)

OTHER PUBLICATIONS

Notice of Reasons for Refusal dated Jun. 15, 2021 from the Japanese Patent Office in JP Application No. 2020-520104.
(Continued)

*Primary Examiner* — Eric Yaary
(74) *Attorney, Agent, or Firm* — Sughrue Mion, PLLC

(57) ABSTRACT

A device for generating an aerosol includes: a body portion including a controller, a heater, and a magnetic sensor, and a sliding member including a magnet and configured to move between a first position and a second position along the body portion, wherein the magnetic sensor detects movement of the magnet, and wherein the controller activates the device when the magnetic sensor detects that the sliding member is moved from the first position to the second position.

14 Claims, 4 Drawing Sheets

(51) Int. Cl.
*A24F 40/53* (2020.01)
*A24F 40/40* (2020.01)
*A24F 40/60* (2020.01)

(56) References Cited

U.S. PATENT DOCUMENTS

| | | |
|---|---|---|
| 2017/0099877 A1 | 4/2017 | Worm et al. |
| 2017/0150757 A1 | 6/2017 | Worm et al. |
| 2018/0160741 A1 | 6/2018 | Worm et al. |
| 2020/0120988 A1 | 4/2020 | Qiu |
| 2020/0154772 A1 | 5/2020 | Lim et al. |
| 2020/0281273 A1 | 9/2020 | Kim et al. |
| 2020/0337377 A1* | 10/2020 | Rogan .................. A24F 40/44 |

FOREIGN PATENT DOCUMENTS

| | | |
|---|---|---|
| CN | 208425528 U | 1/2019 |
| EP | 3626094 B1 | 11/2021 |
| KR | 101069342 B1 | 10/2011 |
| KR | 200479425 Y1 | 1/2016 |
| KR | 101820847 B1 | 1/2018 |
| KR | 10-2018-0070439 A | 6/2018 |
| KR | 1020180114825 A | 10/2018 |
| WO | 2019/001386 A1 | 1/2019 |

OTHER PUBLICATIONS

International Search Report dated Sep. 9, 2020, in International Application No. PCT/KR2020/001933.
Communication dated Aug. 24, 2020, from the Korean Intellectual Property Office in application No. 10-2019-0016832.
Extended European Search Report dated Nov. 11, 2021 in EP Application No. 20720895.0.
Office Action dated Dec. 27, 2022 in Chinese Application No. 202080000515.5.

* cited by examiner

[Fig. 1]
100
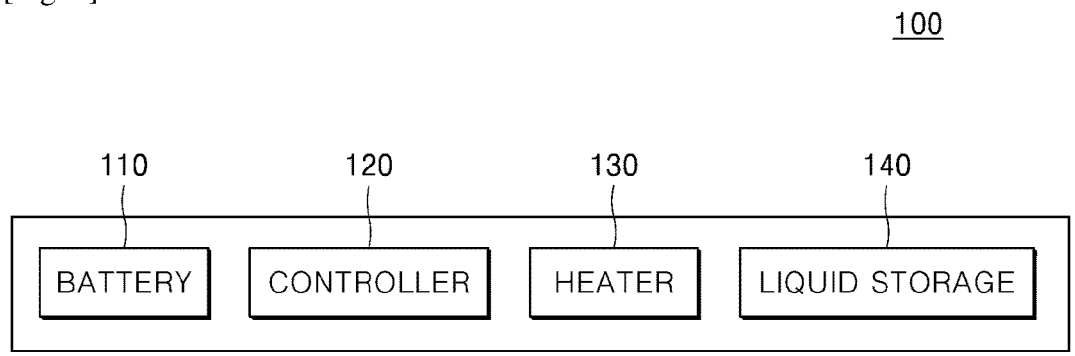
[Fig. 2]
200
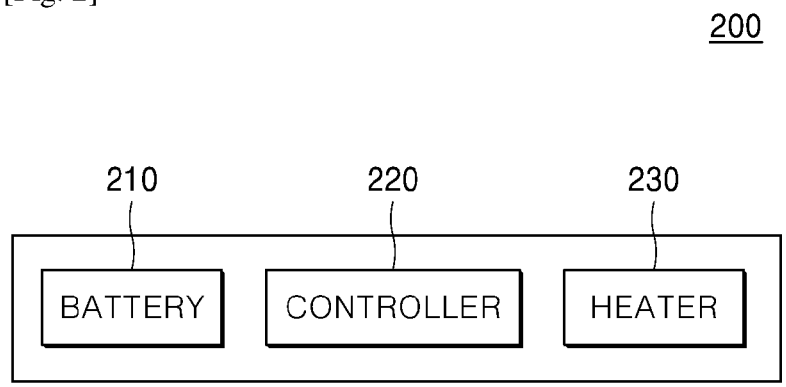
[Fig. 3]
300
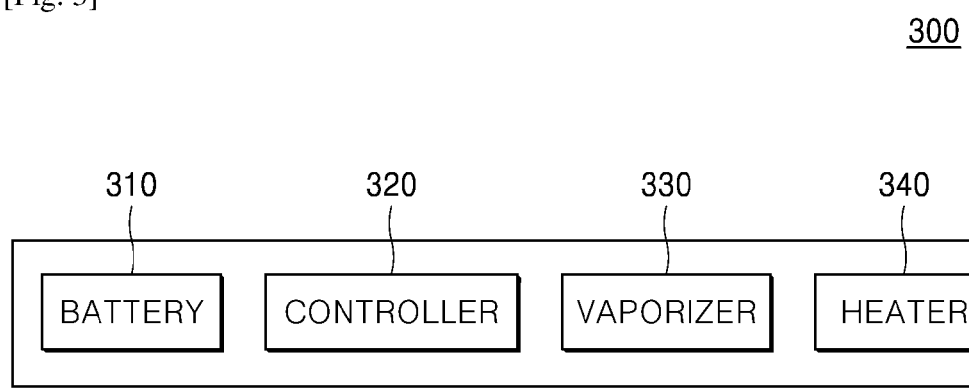

[Fig. 4A]
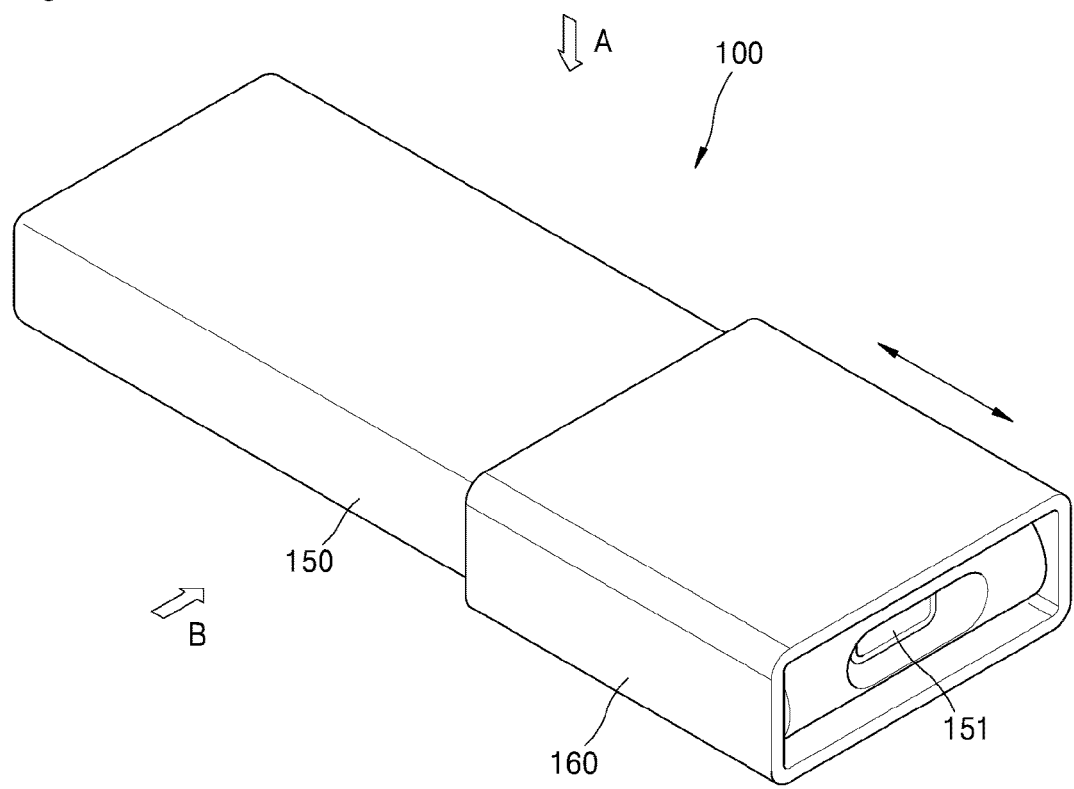
[Fig. 4B]
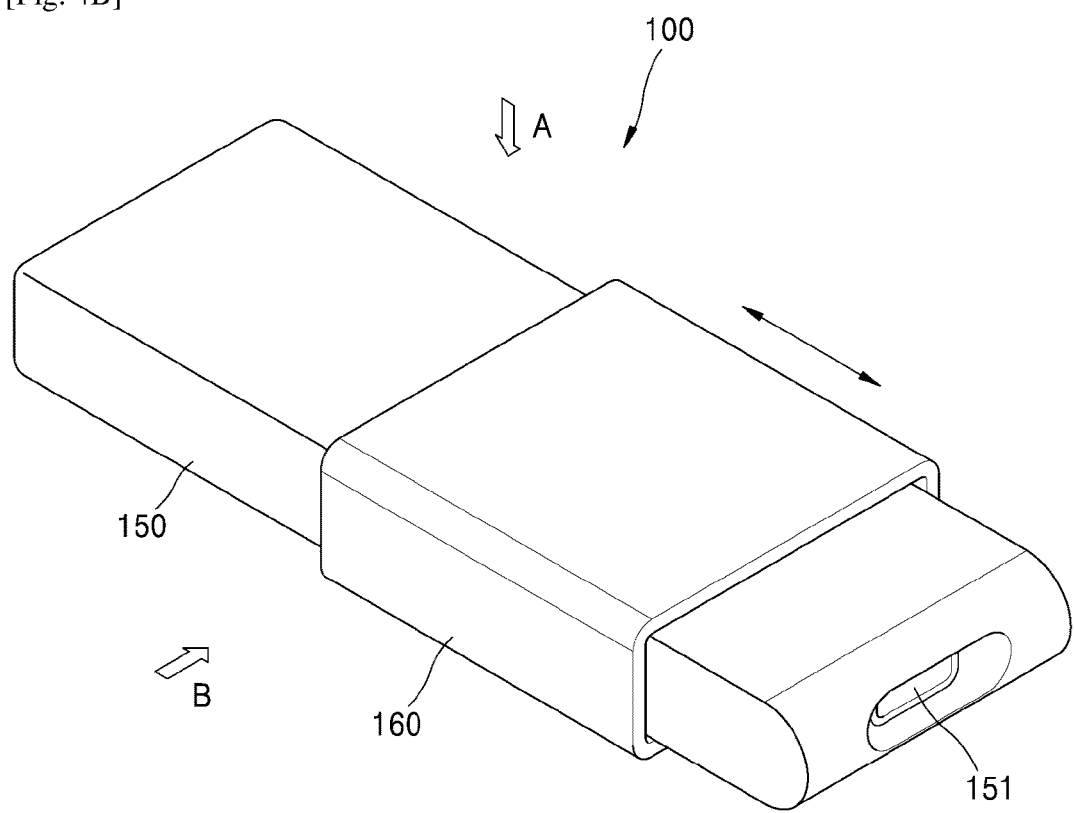

[Fig. 5A]
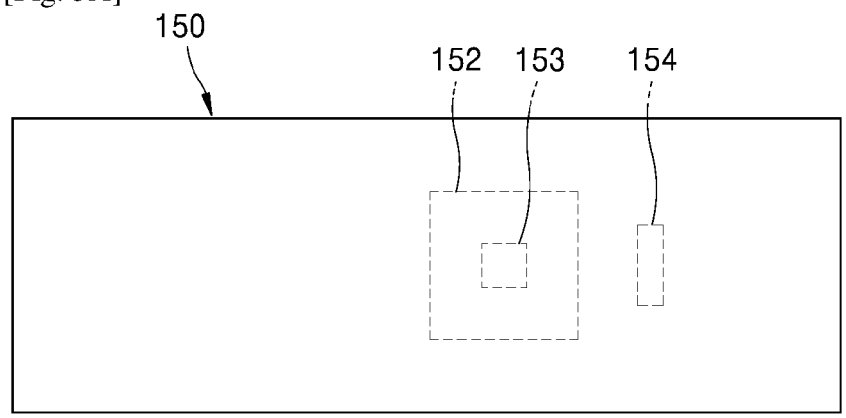
[Fig. 5B]
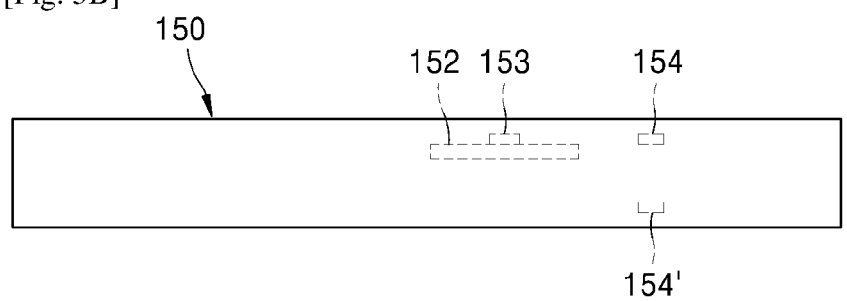
[Fig. 6A]
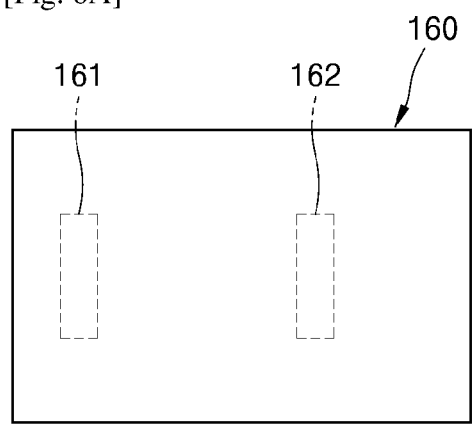
[Fig. 6B]
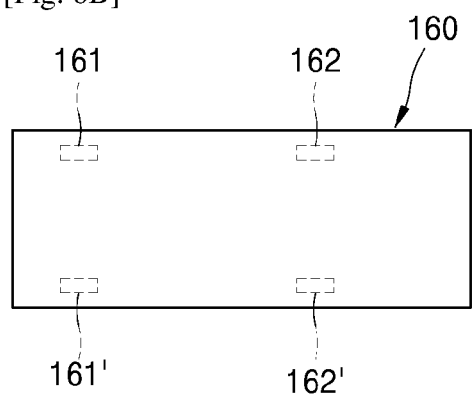

[Fig. 7]
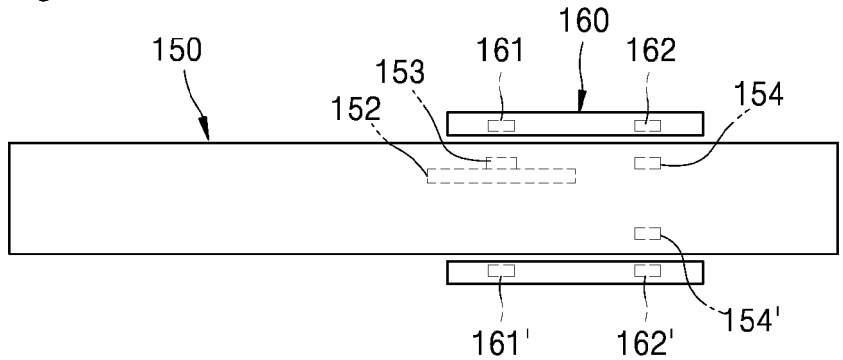
[Fig. 8]
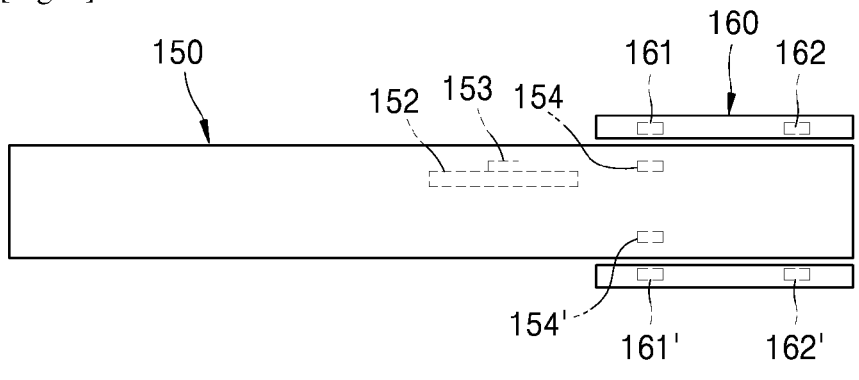
[Fig. 9]
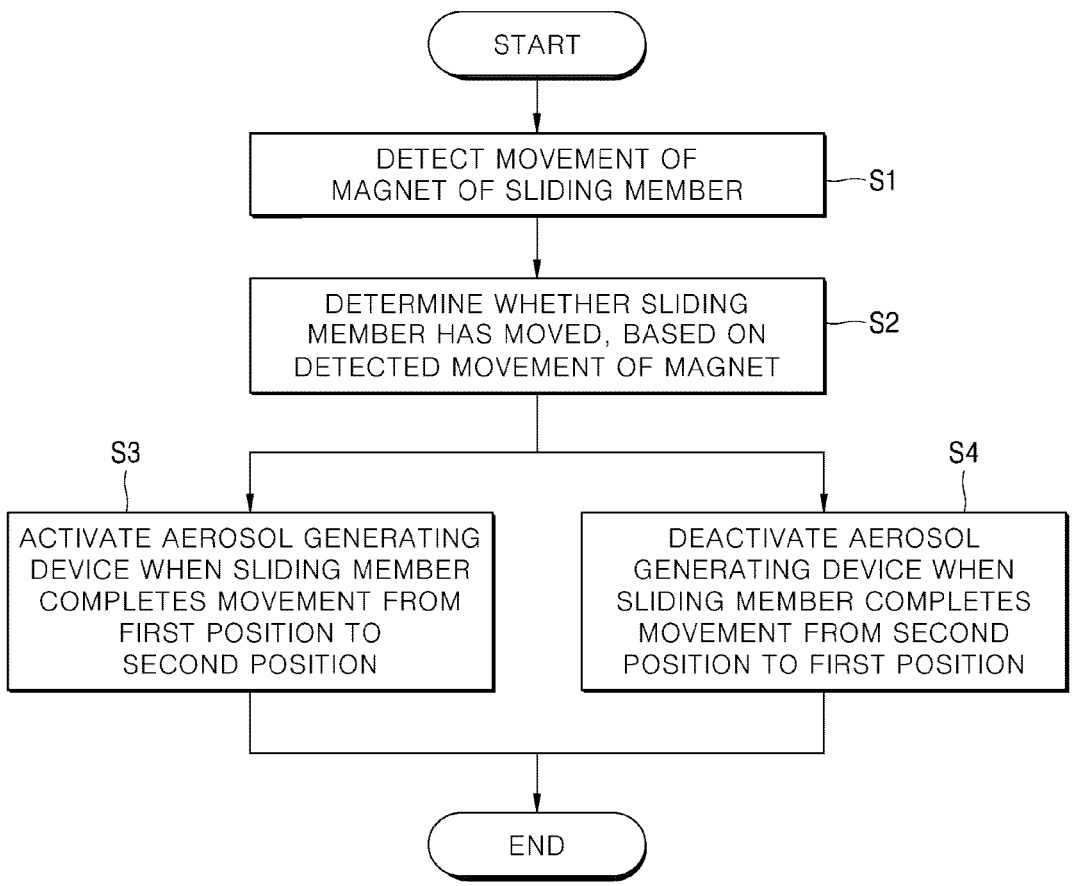

AEROSOL GENERATING DEVICE INCLUDING MAGNETIC SENSOR AND METHOD OF OPERATING THE SAME

CROSS REFERENCE TO RELATED APPLICATIONS

This application is a National Stage of International Application No. PCT/KR2020/001933 filed Feb. 12, 2020, claiming priority based on Korean Patent Application No. 10-2019-0016832 filed Feb. 13, 2019.

TECHNICAL FIELD

The present disclosure relates to a device for generating aerosol by heating a heater and a method of operating the device.

BACKGROUND ART

Recently, the demand for alternative methods to overcome the shortcomings of general cigarettes has increased. For example, there is an increasing demand for a method of generating aerosol by heating an aerosol generating material in cigarettes, rather than by burning cigarettes. Accordingly, studies on a heating-type cigarette and a heating-type aerosol generating device have been actively conducted.

The aerosol generating device may include a heater for heating an aerosol generating material of a cigarette or liquid storage, and an inhalation sensor. The heater may start heating when the inhalation sensor senses a user's inhalation. However, since the heater starts heating when the user starts inhalation, a sufficient atomization amount may not be provided to the user.

Also, the aerosol generating device is required to have an intuitive operation scheme so that any user can easily operate the aerosol generating device.

Accordingly, there is a need for an aerosol generating device capable of providing a sufficient atomization amount to a user and having an intuitive operation scheme.

DISCLOSURE OF INVENTION

Technical Problem

Provided is an aerosol generating device capable of providing a sufficient atomization amount to a user. In addition, provided is an aerosol generating device that a user may operate intuitively.

The technical goal is not limited to the above, and other technical goals may be inferred from the following examples.

Solution to Problem

According to an exemplary embodiment of the disclosure, a device for generating aerosol includes: a body portion including a controller, a heater, and a magnetic sensor; and a sliding member including a magnet and configured to move between a first position and a second position along the body portion, wherein the magnetic sensor detects movement of the magnet, and wherein the controller activates the device when the magnetic sensor detects that the sliding member is moved from the first position to the second position.

The controller may deactivate the device when the magnetic sensor detects that the sliding member moved from the second position to the first position.

The controller may start preheating of the heater when the sliding member completes moving from the first position to the second position.

The magnet may be arranged adjacent to the magnetic sensor when the sliding member is located at the second position.

The body portion may further include a first magnetic coupling member spaced apart from the magnetic sensor, and when the sliding member is located at the first position, the magnet may be arranged adjacent to the first magnetic coupling member such that the first magnetic coupling member and the magnet are magnetically coupled.

The sliding member may further include a second magnetic coupling member spaced apart from the magnet, and when the sliding member is located at the second position, the second magnetic coupling member may be arranged adjacent to the first magnetic coupling member such that the first magnetic coupling member and the second magnetic coupling member are magnetically coupled.

The first magnetic coupling member may be spaced apart from the magnetic sensor in a longitudinal direction of the device.

The second magnetic coupling member may be spaced apart from the magnet in a longitudinal direction of the device.

At least one of the first magnetic coupling member and the second magnetic coupling member may have magnetism.

The magnetic sensor may include at least one of a hall effect sensor, a rotating coil, a magnetoresistor, and a superconducting quantum interference device (SQUID).

The first position may be closer to an upper end of the body portion than the second position.

The sliding member may surround at least a portion of a side of the body portion.

The sliding member may move in a longitudinal direction of the body portion.

According to another exemplary embodiment, a method of controlling an aerosol generating device includes: detecting movement of a magnet included in the sliding member; activating the aerosol generating device when the detected movement indicates that the sliding member moved from a first position to a second position; and deactivating the aerosol generating device when the detected movement indicates that the sliding member is moved from the second position to the first position.

The activating the aerosol generating device may include preheating a heater included in the body portion.

Additional aspects will be set forth in part in the description which follows and, in part, will be apparent from the description, or may be learned by practice of the presented exemplary embodiments of the disclosure.

BRIEF DESCRIPTION OF DRAWINGS

The above and other aspects, features, and advantages of certain exemplary embodiments of the disclosure will be more apparent from the following description taken in conjunction with the accompanying drawings, in which:

FIGS. 1 to 3 are diagrams illustrating examples of an aerosol generating device;

FIG. 4A illustrates an example of an aerosol generating device in which a sliding member is located at a first position;

FIG. 4B illustrates an example of an aerosol generating device in which a sliding member is located at a second position;

FIGS. 5A and 5B illustrate examples of side views showing the inside of a body portion;

FIGS. 6A and 6B illustrate examples of side views showing the inside of a sliding member;

FIG. 7 illustrates an example of an aerosol generating device in which a sliding member is located at a second position;

FIG. 8 illustrates an example of an aerosol generating device in which a sliding member is located at a first position; and FIG. 9 is a flowchart illustrating an example of a method of activating and deactivating an aerosol generating device.

BEST MODE FOR CARRYING OUT THE INVENTION

According to an exemplary embodiment of the disclosure, a device for generating aerosol includes: a body portion including a controller, a heater, and a magnetic sensor; and a sliding member including a magnet and configured to move between a first position and a second position along the body portion, wherein the magnetic sensor detects movement of the magnet, and wherein the controller activates the device when the magnetic sensor detects that the sliding member is moved from the first position to the second position.

MODE FOR THE INVENTION

With respect to the terms used to describe the various exemplary embodiments, general terms which are currently and widely used are selected in consideration of functions of structural elements in the various exemplary embodiments of the present disclosure. However, meanings of the terms can be changed according to intention, a judicial precedence, the appearance of new technology, and the like. Also, some terms may be arbitrarily selected by the applicant. In this case, the meaning of the selected terms will be described in the detailed description. Thus, the terms used herein have to be defined based on the meaning of the terms together with the description throughout the specification.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and/or operation and can be implemented by hardware components or software components and combinations thereof.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

FIGS. 1 to 3 are diagrams illustrating examples of an aerosol generating device.

Referring to FIG. 1, an aerosol generating device 100 includes a battery 110, a controller 120, a heater 130, and a liquid storage 140.

FIG. 1 illustrates that the battery 110, the controller 120, and the liquid storage 140 are arranged in series. However, the internal structure of the aerosol generating device 100 is not limited to the structures illustrated in FIG. 1. In other words, according to another embodiment, the battery 110, the controller 120, the heater 130, and the liquid storage 140 may be differently arranged.

The battery 110 may supply power to be used for the aerosol generating device 100 to operate. For example, the battery 110 may supply power to heat the heater 130, and may supply power for operating the controller 120. Also, the battery 110 may supply power for operations of a display, a sensor, a motor, etc. mounted in the aerosol generating device 100.

The controller 120 may generally control operations of the aerosol generating device 100. In detail, the controller 120 may control not only operations of the components shown in FIG. 1 (i.e., the battery 110, the heater 130, and the liquid storage 140), but also operations of other components of the aerosol generating device 100 which are not shown in FIG. 1. Also, the controller 120 may check a state of each component of the aerosol generating device 100 to determine whether or not the aerosol generating device 100 is in an operable state.

The controller 120 may include at least one processor. A processor can be implemented as an array of a plurality of logic gates or can be implemented as a combination of a general-purpose microprocessor and a memory in which a program executable in the microprocessor is stored. It will be understood by one of ordinary skill in the art that the processor can be implemented in other forms of hardware.

The liquid storage 140 may store a liquid composition. For example, the liquid composition may be a liquid including a tobacco-containing material and/or a non-tobacco material. The liquid storage 140 may be formed to be detachable from the heater 130. Alternatively, the liquid storage 140 may be formed integrally with the heater 130.

For example, the liquid composition may include water, nicotine, nicotine salt, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The aerosol generating device 100 may include a liquid delivery element that delivers the liquid composition of the liquid storage 140 to the heater 130. For example, the liquid delivery element may be a wick such as cotton fiber, ceramic fiber, glass fiber, or porous ceramic, but is not limited thereto.

The heater 130 is an element for heating the liquid composition delivered by the liquid delivery element. For example, the heater 130 may be a metal heating wire, a metal hot plate, a ceramic heater, or the like, but is not limited thereto. In addition, the heater 130 may include a conductive filament such as nichrome wire and may be wound around the liquid delivery element. The heater 130 may be heated by an electric current and may transfer heat to the liquid composition in contact with the heater 130, thereby heating the liquid composition. As a result, aerosol may be generated.

For example, the heater 130, the liquid delivery element (not shown), and the liquid storage 140 may be collectively referred to as a cartomizer or an atomizer, but the name is not limited thereto.

Referring to FIG. 2, an aerosol generating device 200 includes a battery 210, a controller 220, and a heater 230. A cigarette may be inserted into an inner space of the aerosol generating device 200.

The battery 210 supplies electric power used for the aerosol generating device 200 to operate. The controller 220 may generally control operations of the aerosol generating device 200.

The heater 230 may be heated by the power supplied from the battery 210. For example, when the cigarette is inserted into the aerosol generating device 200, the heater 230 may be located outside the cigarette such that the heated heater 230 may increase a temperature of an aerosol generating material in the cigarette.

As necessary, the aerosol generating device 200 may heat the heater 230 even when the cigarette is not inserted into the aerosol generating device 200.

The heater 230 may be implemented using an electro-resistive heater. For example, the heater 230 may include an electrically conductive track so that the heater 230 may be heated when currents flow through the electrically conductive track. However, the heater 230 is not limited thereto and may be implemented any type of heater that is capable of being heated to a desired temperature. Here, the desired temperature may be pre-set in the aerosol generating device 200 or may be set manually by a user.

As another example, the heater 230 may be implemented using an induction heater. In detail, the heater 230 may include an electrically conductive coil for heating a cigarette by an induction heating method, and the cigarette may include a susceptor which may be heated by the induction heater.

For example, the heater 230 may include a tube-type heating element, a plate-type heating element, a needle-type heating element, or a rod-type heating element. The heater 230 may heat the inside or the outside of the cigarette, according to the shape of the heating element.

Also, the aerosol generating device 200 may include a plurality of heaters 230. Here, the plurality of heaters 230 may be inserted into the cigarette or may be arranged outside the cigarette. Also, one or more of the plurality of heaters 230 may be inserted into the cigarette and the others may be arranged outside the cigarette.

Referring to FIG. 3, an aerosol generating device 300 includes a battery 310, a controller 320, a vaporizer 330, and the first heater 340. A cigarette may be inserted into an inner space of the aerosol generating device 300.

When the cigarette is inserted into the aerosol generating device 300, the aerosol generating device 300 may operate the first heater 340 and/or the vaporizer 330 to generate aerosol. The aerosol generated by the first heater 340 and/or the vaporizer 330 is delivered to a user after passing through the cigarette.

As necessary, the aerosol generating device 300 may heat the first heater 340 even when the cigarette is not inserted into the aerosol generating device 300.

The battery 310 may supply power to be used for the aerosol generating device 300 to operate. The controller 320 may generally control operations of the aerosol generating device 300.

The vaporizer 330 may generate aerosol by heating a liquid composition and the generated aerosol may pass through the cigarette to be delivered to a user. In other words, the aerosol generated by the vaporizer 330 may move along an air flow passage of the aerosol generating device 300. The air flow passage may be configured such that the aerosol generated by the vaporizer 330 passes through the cigarette to be delivered to the user.

For example, the vaporizer 330 may include a liquid storage, a liquid delivery element, and a second heater, but it is not limited thereto. For example, the liquid storage, the liquid delivery element, and the second heater may be included in the aerosol generating device 300 as independent modules.

The liquid storage may store a liquid composition. For example, the liquid composition may be a liquid including a tobacco-containing material having a volatile tobacco flavor component and/or a non-tobacco material. The liquid storage may be formed to be detachable from the vaporizer 330. Alternatively, the liquid storage may be formed integrally with the vaporizer 330.

The liquid delivery element may deliver the liquid composition of the liquid storage to the second heater. The second heater is an element for heating the liquid composition delivered from the liquid storage by the liquid delivery element.

For example, the vaporizer 330 may be referred to as a cartomizer or an atomizer, but the name is not limited thereto.

The first heater 340 may be the same as or similar to the heater 230 of FIG. 2. The second heater included in the vaporizer 330 may be the same as or similar to the heater 130 of FIG. 1.

The aerosol generating devices 100, 200, and 300 of FIGS. 1 through 3 may further include general-purpose components. For example, the aerosol generating devices 100, 200, and 300 may include a display capable of outputting visual information and/or a motor for outputting haptic information. Also, the aerosol generating devices 100, 200, and 300 may include at least one sensor (e.g., a puff detecting sensor, a temperature detecting sensor, a cigarette insertion detecting sensor, etc.).

Although not illustrated in FIGS. 1 through 3, an additional cradle may be used with the aerosol generating devices 100, 200, and 300, as a system. For example, the cradle may be used to charge the batteries 110, 210, and 310 of the aerosol generating devices 100, 200, and 300. Alternatively, the heaters 130, 230, and 340 may be heated when the cradle and the aerosol generating devices 100, 200, and 300 are coupled to each other.

The cigarette inserted into the aerosol generating devices 200 and 300 may be similar to a general combustive cigarette. For example, the cigarette may comprise an aerosol generating material and a filter.

Hereinafter, components for activating and deactivating the aerosol generating device 100 of FIG. 1 and a method of operating the aerosol generating device 100 will be described. The components and the operation method described below may also be applied to the aerosol generating devices 200 and 300 of FIGS. 2 and 3.

FIG. 4A illustrates an example of an aerosol generating device in which a sliding member 160 is located at a first position. FIG. 4B illustrates an example of an aerosol generating device in which a sliding member is located at a second position.

Referring to FIGS. 4A and 4B, the aerosol generating device 100 may include a body portion 150 and a sliding member 160.

The body portion 150 may include the battery 110, the controller 120, the heater 130, and the liquid storage 140 shown in FIG. 1. In addition, the body portion 150 may include an opening 151 through which aerosol flows out to be provided to a user.

Although not shown in FIGS. 4A and 4B, the body portion 150 may further include a light-emitting diode (LED) or a display for notifying the user of an operating state of the aerosol generating device 100, a button for the user to operate the aerosol generating device 100, and the like.

The body portion 150 may have a size and shape to make it easy for the user to carry the aerosol generating device 100. The body portion 150 is not limited to the shape shown in FIGS. 4A and 4B, and may have, for example, a curved surface that is easy for the user to grab.

The sliding member 160 may be mounted to the body portion 150 in a way that it can slide along the body portion 150. For example, the body part 150 may include a guide rail for guiding the movement of the sliding member 160. Alternatively, the guide rail may be included in the sliding member 160.

The sliding member 160 may move along the body portion 150. In an exemplary embodiment, the sliding member 160 may move along the body portion 150 in the longitudinal direction of the body portion 150. The moving direction of the sliding member 160 is not limited to the longitudinal direction of the body portion 150. In another exemplary embodiment, the sliding member 160 may move in other directions such as a direction perpendicular to the longitudinal direction of the body portion 150 and/or an oblique direction.

The sliding member 160 may move from the first position to the second position and vice versa along the body portion 150. FIG. 4A illustrates a state in which the sliding member 160 is located at the first position, and FIG. 4B illustrates a state in which the sliding member 160 is located at the second position.

The first position may be closer to the upper end (i.e., an end where the opening 151 is formed) of the body portion 150 than the second position.

The sliding member 160 may surround a portion of the body portion 150. That is, the sliding member 160 may cover a portion of the body portion 150 from all directions. Alternatively, the sliding member 160 may partially cover a portion of the body portion 150. That is, a portion of the body portion 150 may not covered by the sliding member 160, regardless of the position of the sliding member 160.

FIGS. 5A and 5B illustrate the body portion 150 according to an exemplary embodiment.

FIG. 5A illustrates the body portion 150 shown in FIG. 4A, when viewed in an A direction. FIG. 5B illustrates the body portion 150 shown in FIG. 4A, when viewed in a B direction.

Referring to FIGS. 5A and 5B, the body portion 150 may include a magnetic sensor (or magnetometer) 153 mounted on a circuit board 152, and a first magnetic coupling member 154.

The magnetic sensor 153 may detect the magnetization of a magnetic material and/or a change in the direction, intensity, etc. of a magnetic field. For example, the magnetic sensor 153 may include a hall effect sensor, a rotating coil, a magnetoresistor, or a superconducting quantum interference device (SQUID), but is not limited thereto. Preferably, the magnetic sensor 153 may include a hall effect sensor.

The magnetic sensor 153 may be arranged at a position suitable for detecting the movement of a magnet included in a sliding member, which will be described later. For example, the magnetic sensor 153 may be arranged close to one side of the body portion 150 to be adjacent to the magnet included in a sliding member.

Although one magnetic sensor 153 is illustrated in FIGS. 5A and 5B, the body portion 150 may include a plurality of magnetic sensors.

The first magnetic coupling members 154 and 154' may be capable of magnetic coupling. The first magnetic coupling member 154 may include an object having magnetism or a member that magnetically couples with an object having magnetism. For example, each of the first magnetic coupling members 154 and 154' may include a magnet or a magnetic body such as iron, nickel, cobalt, or an alloy thereof.

The first magnetic coupling members 154 and 154' may be spaced apart from the magnetic sensor 153. For example, the first magnetic members 154 and 154' may be spaced apart from the magnetic sensor 153 in the longitudinal direction of the aerosol generating device 100. The first magnetic members 154 and 154' may be arranged closer to the opening 151 of FIG. 4 than the magnetic sensor 153. Alternatively, the magnetic sensor 153 may be arranged closer to the opening 151 of FIG. 4 than the first magnetic members 154 and 154'.

In FIGS. 5A and 5B, the first magnetic coupling members 154 and 154' have rectangular cross-sections. However, the first magnetic members 154 and 154' may have a different cross-section shape. For example, a cross of the first magnetic members 154 and 154' may be, but is not limited to, circular, elliptical, polygonal, or the like.

In FIGS. 5A and 5B, two first magnetic coupling members 154 and 154' are shown. However, the number of the first magnetic members are not limited thereto. For example, the body portion 150 may include only one first magnetic member. Alternatively, the body portion 150 may include three or more first magnetic members.

FIGS. 6A and 6B illustrate the sliding member 160 according to an exemplary embodiment.

FIG. 6A illustrates the sliding member 160 shown in FIG. 4A, when viewed in the A direction. FIG. 6B illustrates the sliding member 160 shown in FIG. 4A, when viewed in the B direction.

Referring to FIGS. 6A and 6B, the sliding member 160 may include magnets 161 and 161' and second magnetic coupling members 162 and 162'.

The magnets 161 and 161' are objects that generate a magnetic field. Examples of the magnets 161 and 161' may include, but are not limited to, neodymium magnets, rubber magnets, or electromagnets, etc. For example, the magnets 161 and 161' may include samarium, scandium, neodymium, yttrium, or the like.

In FIGS. 6A and 6B, the magnets 161 and 161' have rectangular cross-sections. However, the magnets 161 and 161' may have cross-sections of different shapes. For example, the cross section of the magnets 161 and 161' may be, but is not limited to, circular, elliptical, polygonal, or the like.

In FIGS. 6A and 6B, two magnets 161 and 161' are shown. However, the number of the magnets included in the sliding member 160 is not limited thereto. For example, the sliding member 160 may include only one magnet. Alternatively, the sliding member 160 may include three or more magnets.

The second magnetic coupling members 162 and 162' are capable of magnetic coupling. The second magnetic coupling members 162 and 162' may include an object having magnetism or a member that magnetically couples with an object having magnetism. For example, each of the second magnetic coupling members 162 and 162' may include a magnet or a magnetic body such as iron, nickel, cobalt, or an alloy thereof.

In FIGS. 6A and 6B, two second magnetic coupling members 162 and 162' are shown. However, the number of the second magnetic members is not limited thereto. For example, the sliding member 160 may include only one second magnetic member 162. Alternatively, the sliding member 160 may include three or more second magnetic members.

The second magnetic coupling members 162 and 162' may be spaced apart from the magnets 161 and 161'. For example, the second magnetic coupling members 162 and 162' may be spaced apart from the magnets 161 and 161' in the longitudinal direction of the aerosol generating device 100.

The distance between the magnet 161 and the second magnetic coupling member 162 may be equal to or similar to the distance between the magnetic sensor 153 and the first magnetic coupling member 154 in FIG. 5A. This is to ensure that, when the sliding member 160 is located at the second position, the magnet 161 is adjacent to the magnetic sensor 153 and the second magnetic coupling member 162 is adjacent to the first magnetic coupling member 154.

FIG. 7 illustrates an example of an aerosol generating device in which a sliding member is located at a second position.

When the sliding member 160 is located at the second position, the magnet 161 may be arranged adjacent to the magnetic sensor 153. In this case, the magnetic sensor 153 may detect the movement of the magnet 161 based on the magnetic field of the magnet 161. For example, the magnetic sensor 153 may detect the movement of the magnet 161 based on a voltage generated by the magnetic field of the magnet 161.

Meanwhile, the second magnetic coupling members 162 and 162' may be arranged adjacent to the first magnetic coupling members 154 and 154'. In this case, the second magnetic coupling members 162 and 162' and the first magnetic coupling members 154 and 154' may be magnetically coupled. To this end, at least one of the first magnetic coupling members 154 and 154' and/or at least one of the second magnetic coupling members 162 and 162' may have magnetic properties. For example, the first magnetic coupling members 154 and 154' may include magnets, and the second magnetic coupling members 162 and 162' may include iron plates. In another example, the first magnetic coupling members 154 and 154' may include iron plates, and the second magnetic coupling members 162 and 162' may include magnets. As another example, both the first magnetic coupling members 154 and 154' and the second magnetic coupling members 162 and 162' may include magnets. In another example, the first magnetic coupling member 154 may include an iron plate, the second magnetic coupling member 162 may include a magnet, the first magnetic coupling member 154' may include a magnet, and the second magnetic coupling member 162' may include an iron plate.

As the second magnetic coupling members 162 and 162' and the first magnetic coupling members 154 and 154' are magnetically coupled, the sliding member 160 may be fixed in the second position.

FIG. 8 illustrates an example of an aerosol generating device in which a sliding member is located at a first position.

When the sliding member 160 is located at the first position, the magnets 161 and 161' may be arranged adjacent to the first magnetic coupling members 154 and 154'. In this case, the magnets 161 and 161' may be magnetically coupled to the first magnetic coupling members 154 and 154'.

As the magnets 161 and 161' and the first magnetic coupling members 154 and 154' are magnetically coupled, the sliding member 160 may be fixed in the first position.

FIG. 9 is a flowchart illustrating an example of a method of activating and deactivating an aerosol generating device.

In Operation S1, the magnetic sensor 153 may detect the movement of the magnet 161 of the sliding member 160. The magnetic sensor 153 may detect the movement of the magnet 161 from the first position to the second position and may output a first signal. In addition, the magnetic sensor 153 may detect the movement of the magnet 161 from the second position to the first position and may output a second signal.

In Operation S2, a controller (e.g., the controller 120 of FIG. 1) may determine whether the sliding member 160 has moved based on the output signal of the magnetic sensor 153. When receiving the first signal from the magnetic sensor 153, the controller may determine that the sliding member 160 has moved from the first position to the second position. In addition, when receiving the second signal from the magnetic sensor 153, the controller may determine that the sliding member 160 has moved from the second position to the first position.

In Operation S3, when it is determined that the sliding member 160 has completed the movement from the first position to the second position as the controller receives the first signal from the magnetic sensor 153, the controller may activate the aerosol generating device. In addition, the controller may control a heater (e.g., the heater 130 of FIG. 1) included in the aerosol generating device to start heating, so that the heater is preheated prior to the user's inhalation. That is, in the case of the aerosol generating device 200 of FIG. 2, the preheating of the heater 230 may be started. In the case of the aerosol generating device 300 of FIG. 3, the preheating of the first heater 340 and/or the second heater included in the vaporizer 330 may be started.

In Operation S4, when it is determined that the sliding member 160 has completed the movement from the second position to the first position as the controller receives the second signal from the magnetic sensor 153, the controller may deactivate the aerosol generating device. As the aerosol generating device is deactivated, the heating of the heater may be terminated.

As such, the user may easily activate or deactivate the aerosol generating device through a simple operation of sliding the sliding member. In addition, when the user slides the sliding member, the heater starts preheating and heating of the aerosol generating material before the user starts inhaling, thereby providing a sufficient atomization amount to the user.

In addition, since the aerosol generating device is activated or deactivated by an intuitive manipulation of moving the sliding member, the user may easily operate the aerosol generating device.

The effect of the inventive concept is not limited by the contents exemplified above, and more various effects are included in the present specification.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope of the disclosure as defined by the following claims.

The invention claimed is:

1. A device for generating aerosol, the device comprising:
a body portion including a controller, a heater, and a magnetic sensor; and
a sliding member including a magnet and configured to move between a first position and a second position along the body portion,
wherein the magnetic sensor detects movement of the magnet,
wherein the controller activates the device when the magnetic sensor detects that the sliding member is moved from the first position to the second position,
wherein the body portion further includes a first magnetic coupling member spaced apart from the magnetic sensor,
wherein the sliding member further includes a second magnetic coupling member spaced apart from the magnet, and
wherein, when the sliding member is located at the second position, the second magnetic coupling member is arranged adjacent to the first magnetic coupling member such that the first magnetic coupling member and the second magnetic coupling member are magnetically coupled.

2. The device of claim 1, wherein the controller deactivates the device when the magnetic sensor detects that the sliding member is moved from the second position to the first position.

3. The device of claim 1, wherein the controller starts preheating of the heater when the sliding member completes moving from the first position to the second position.

4. The device of claim 1, wherein the magnet is arranged adjacent to the magnetic sensor when the sliding member is located at the second position.

5. The device of claim 4,
wherein, when the sliding member is located at the first position, the magnet is arranged adjacent to the first magnetic coupling member such that the first magnetic coupling member and the magnet are magnetically coupled.

6. The device of claim 1, wherein the first magnetic coupling member is spaced apart from the magnetic sensor in a longitudinal direction of the device.

7. The device of claim 5, wherein the second magnetic coupling member is spaced apart from the magnet in a longitudinal direction of the device.

8. The device of claim 1, wherein at least one of the first magnetic coupling member and the second magnetic coupling member has magnetism.

9. The device of claim 1, wherein the magnetic sensor includes at least one of a hall effect sensor, a rotating coil, a magnetoresistor, and a superconducting quantum interference device (SQUID).

10. The device of claim 1, wherein the first position is closer to an upper end of the body portion than the second position.

11. The device of claim 1, wherein the sliding member surrounds at least a portion of a side of the body portion.

12. The device of claim 1, wherein the sliding member moves in a longitudinal direction of the body portion.

13. A method of controlling an aerosol generating device including a body portion and a sliding member moving along the body portion, the method comprising:
detecting movement of a magnet included in the sliding member;
activating the aerosol generating device when the detected movement indicates that the sliding member is moved from a first position to a second position; and
deactivating the aerosol generating device when the detected movement indicates that the sliding member is moved from the second position to the first position,
wherein the body portion further includes a first magnetic coupling member spaced apart from the magnetic sensor,
wherein the sliding member further includes a second magnetic coupling member spaced apart from the magnet, and
wherein, when the sliding member is located at the second position, the second magnetic coupling member is arranged adjacent to the first magnetic coupling member such that the first magnetic coupling member and the second magnetic coupling member are magnetically coupled.

14. The method of claim 13, wherein the activating the aerosol generating device includes preheating a heater included in the body portion.

* * * * *